United States Patent
Hudson et al.

(10) Patent No.: US 12,351,938 B2
(45) Date of Patent: Jul. 8, 2025

(54) METHODS FOR PRODUCING A PRODUCT INGOT HAVING LOW OXYGEN CONTENT

(71) Applicant: GlobalWafers Co., Ltd., Hsinchu (TW)

(72) Inventors: Carissima Marie Hudson, St. Charles, MO (US); JaeWoo Ryu, Chesterfield, MO (US); HyungMin Lee, Cheonan-Si (KR)

(73) Assignee: GlobalWafers Co., Ltd., Hsinchu (TW)

( * ) Notice: Subject to any disclaimer, the term of this patent is extended or adjusted under 35 U.S.C. 154(b) by 251 days.

(21) Appl. No.: 18/152,544

(22) Filed: Jan. 10, 2023

(65) Prior Publication Data

US 2023/0250550 A1 Aug. 10, 2023

Related U.S. Application Data

(60) Provisional application No. 63/308,877, filed on Feb. 10, 2022.

(51) Int. Cl.
| | |
|---|---|
| *C30B 15/20* | (2006.01) |
| *C30B 29/06* | (2006.01) |
| *C30B 33/08* | (2006.01) |

(52) U.S. Cl.
CPC .............. *C30B 15/20* (2013.01); *C30B 29/06* (2013.01); *C30B 33/08* (2013.01)

(58) Field of Classification Search
CPC .......... C30B 15/20; C30B 29/06; C30B 33/08
See application file for complete search history.

(56) References Cited

U.S. PATENT DOCUMENTS

| | | | |
|---|---|---|---|
| 4,040,895 A | 8/1977 | Patrick et al. | |
| 4,545,849 A | 10/1985 | d'Aragona | |
| 5,178,720 A | 1/1993 | Frederick | |
| 5,766,341 A | 6/1998 | Kimbel et al. | |
| 6,599,603 B1 * | 7/2003 | Kato | ........................ C30B 15/00 257/E21.321 |
| 7,125,450 B2 | 10/2006 | Lu et al. | |
| 7,559,988 B2 | 7/2009 | Cho | |
| 7,611,580 B2 | 11/2009 | Lu | |
| 9,951,440 B2 | 4/2018 | Basak et al. | |
| 10,513,796 B2 | 12/2019 | Basak et al. | |
| 10,745,823 B2 | 8/2020 | Samanta et al. | |
| 10,793,969 B2 | 10/2020 | Hudson et al. | |
| 10,920,337 B2 | 2/2021 | Phillips et al. | |
| 10,954,606 B2 | 3/2021 | Hudson et al. | |
| 11,142,844 B2 | 10/2021 | Basak et al. | |
| 2001/0045184 A1 | 11/2001 | Schrenker et al. | |

(Continued)

OTHER PUBLICATIONS

Togawa et al., "Oxygen Transport Mechanism in Czochralski Silicon Melt: II. Vicinity of Growth Interface", J. Electrochem. Soc., vol. 142, No. 8 (1995), pp. 2844-2848.

(Continued)

*Primary Examiner* — Robert M Kunemund
(74) *Attorney, Agent, or Firm* — Armstrong Teasdale LLP

(57) ABSTRACT

Methods for producing a product ingot from a silicon melt held within a crucible are disclosed. The methods involve evaluating one or more ingot puller apparatus to determine if the apparatus is capable of producing low oxygen content silicon product ingots. A sample rod is pulled from the silicon melt and the oxygen content of the sample rod is measured.

14 Claims, 9 Drawing Sheets

(56) References Cited

U.S. PATENT DOCUMENTS

| | | |
|---|---|---|
| 2010/0327890 A1* | 12/2010 | Ounadjela ............ C01B 33/037 |
| | | 324/719 |
| 2018/0017660 A1* | 1/2018 | Roquel ............... G01S 5/02585 |
| 2020/0002837 A1 | 1/2020 | Hudson et al. |
| 2020/0199773 A1 | 6/2020 | Lee et al. |
| 2020/0199775 A1 | 6/2020 | Lee et al. |
| 2020/0208294 A1 | 7/2020 | Hudson et al. |

OTHER PUBLICATIONS

Xu et al., "The Marangoni convection and the oxygen concentration in Czochralski-grown silicon", Journal of Crystal Growth 254 (2003), pp. 298-304.

Hoshikawa et al., "Low Oxygen Content Czochralski Silicon Crystal Growth", Japanese Journal of Applied Physics, vol. 19, No. 1 (1980), pp. L33-L36.

* cited by examiner

METHODS FOR PRODUCING A PRODUCT INGOT HAVING LOW OXYGEN CONTENT

CROSS-REFERENCE TO RELATED APPLICATIONS

This application claims the benefit of U.S. Provisional Patent Application No. 63/308,877, filed Feb. 10, 2022, which is incorporated herein by reference in its entirety.

FIELD OF THE DISCLOSURE

The field of the disclosure relates to methods for producing a product ingot from a silicon melt held within a crucible and, in particular, methods for evaluating ingot puller apparatus which are capable of producing low oxygen content silicon product ingots.

BACKGROUND

Single crystal silicon, which is the starting material for most processes for the fabrication of semiconductor electronic components, is commonly prepared by the so-called Czochralski (CZ) process wherein a single seed crystal is immersed into molten silicon and then grown by slow extraction. Molten silicon is contaminated with various impurities, among which is mainly oxygen, during the time it is contained in a quartz crucible. Some applications such as SOI RF have a relatively low oxygen concentration specification such as 5.0 ppma or less.

Without being bound to any particular theory, it has been found that ingot puller apparatus with the same design (i.e., hot zone design) will be characterized by different oxygen capability (i.e., ability to grow low oxygen ingots such as ingots less than 5.0 ppma). A need exists for methods for characterizing such ingot puller apparatus to determine which ingot puller apparatus are best suited to produce low oxygen silicon ingots.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for producing a product ingot from a silicon melt held within a crucible of an ingot puller apparatus. Solid silicon is added to the crucible. The solid silicon is heated to cause a silicon melt to form in the crucible. A sample rod is pulled from the melt. The sample rod has a sample rod diameter that is less than 50 mm. An oxygen content of the sample rod is measured. A product ingot is pulled from the melt if the oxygen content of the sample rod is below a threshold oxygen content. The product ingot has a diameter. The sample rod diameter is less than the diameter of the product ingot.

Another aspect of the present disclosure is directed to a method for producing a product ingot having an oxygen concentration of less than 5 ppma. Solid silicon is added to a crucible of a first ingot puller apparatus. The solid silicon is heated in the crucible of the first ingot puller apparatus to cause a first silicon melt to form in the crucible. A first sample rod is pulled from the first silicon melt. The first sample rod has a first sample rod diameter. An oxygen content of the first sample rod is measured. Solid silicon is added to a crucible of a second ingot puller apparatus. The solid silicon in the crucible of the second ingot puller apparatus is heated to cause a second silicon melt to form in the crucible. A second sample rod is pulled from the second silicon melt. The second sample rod has a second sample rod diameter. An oxygen content of the second sample rod is measured. The oxygen content of the first sample rod is compared to the oxygen content of the second sample rod. The product ingot is grown in the ingot puller apparatus in which the sample rod having a lower oxygen content was grown. The product ingot has a diameter. The first sample rod diameter and second sample rod diameter each are less than the diameter of the product ingot.

Yet another aspect of the present disclosure is directed to a method for characterizing the oxygen capability of an ingot puller apparatus. The ingot puller apparatus includes a crystal growth chamber and a crucible disposed within the crystal growth chamber. Solid silicon is added to the crucible. The solid silicon is heated to cause a silicon melt to form in the crucible. A sample rod is pulled from the melt. The sample rod has a sample rod diameter that is less than 50 mm. The sample rod is processed into a sample rod segment. The sample rod segment is analyzed with a Fourier-transform infrared spectrometer. An oxygen content of the sample rod segment is measured.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
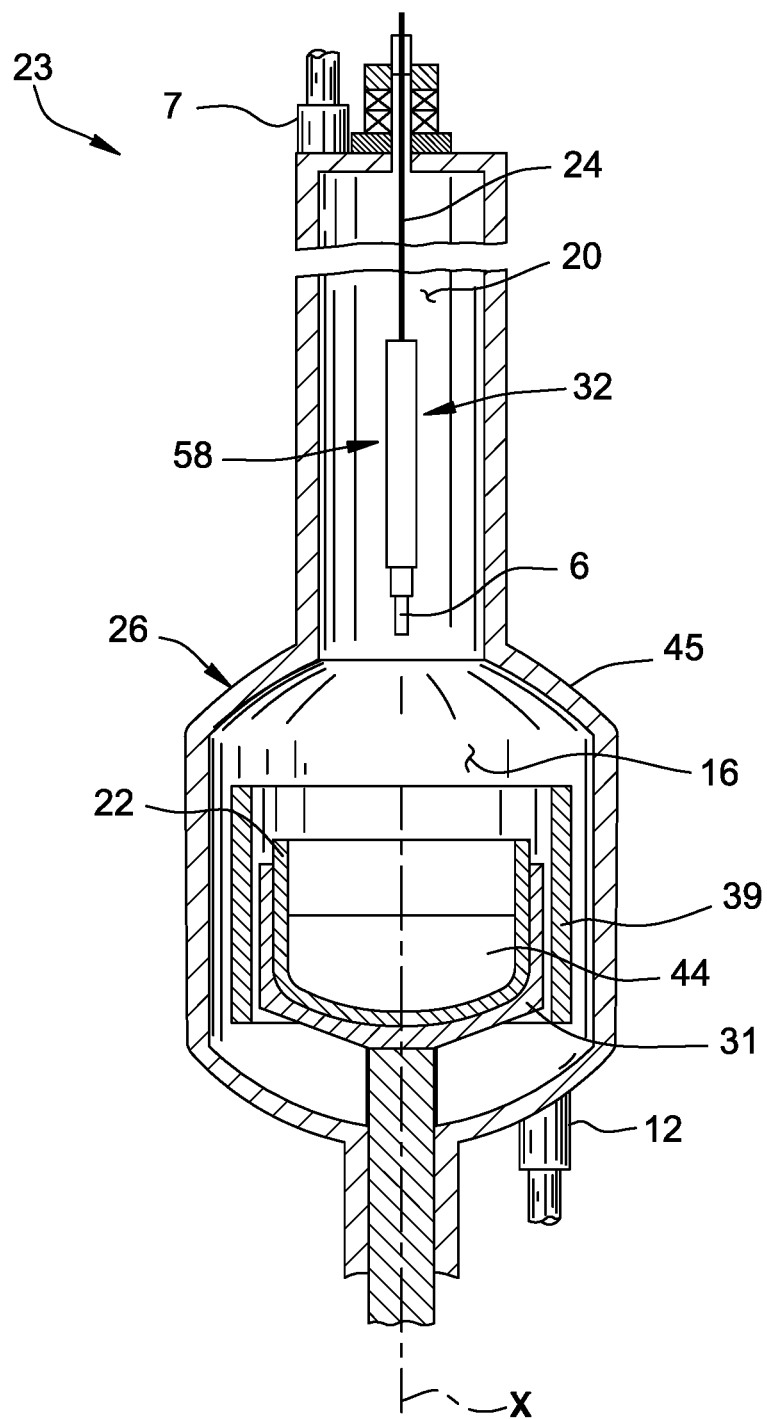
FIG. 1 is a schematic side view of an ingot puller apparatus for forming a single crystal silicon ingot.

Provisions of the present disclosure relate to methods for characterizing the oxygen capability of an ingot puller apparatus and to methods for producing a silicon product ingot with relatively low oxygen. In accordance with embodiments of the present disclosure and with reference to FIG. 1, the product ingot is grown by the so-called Czochralski process in which the ingot is withdrawn from a silicon melt 44 held within a crucible 22 of an ingot puller apparatus 23. The ingot puller apparatus 23 includes a housing 26 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller apparatus 23 includes an inlet port 7 and an outlet port 12 which may be used to introduce and remove a process gas (e.g., argon) to and from the housing 26 during crystal growth.

The crucible 22 within the ingot puller apparatus 23 contains the silicon melt 44 from which a silicon ingot is drawn. The silicon melt 44 is obtained by heating the solid silicon charged to the crucible 22 to cause it to melt. The crucible 22 is mounted on a turntable 31 for rotation of the crucible 22 about a central longitudinal axis X of the ingot puller apparatus 23.

A heating system 39 (e.g., an electrical resistance heater) surrounds the crucible 22 for melting the silicon charge to produce the melt 44. The heating system 39 may also extend below the crucible as shown in U.S. Pat. No. 8,317,919. The heating system 39 is controlled by a control system (not shown) so that the temperature of the melt 44 is precisely controlled throughout the pulling process. Insulation (not shown) surrounding the heating system 39 may reduce the amount of heat lost through the housing 26. The ingot puller apparatus 23 may also include a heat shield assembly (not shown) above the melt surface for shielding the ingot from the heat of the crucible 22 to increase the axial temperature gradient at the solid-melt interface.

A pulling mechanism (not shown) is attached to a pull wire 24 that extends down from the mechanism. The mechanism is capable of raising and lowering the pull wire 24. The ingot puller apparatus 23 may have a pull shaft rather than a wire, depending upon the type of puller. The pull wire 24 terminates in a pulling assembly 58 that includes a seed crystal chuck 32 which holds a seed crystal 6 used to grow the silicon ingot. In growing the ingot, the pulling mechanism lowers the seed crystal 6 until it contacts the surface of the silicon melt 44. Once the seed crystal 6 begins to melt, the pulling mechanism slowly raises the seed crystal up through the growth chamber 16 and pull chamber 20 to grow the monocrystalline ingot. The speed at which the pulling mechanism rotates the seed crystal 6 and the speed at which the pulling mechanism raises the seed crystal (i.e., the pull rate v) are controlled by the control system.

A process gas is introduced through the inlet port 7 into the housing 26 and is withdrawn from the outlet port 12. The process gas creates an atmosphere within the housing 26 and the melt and atmosphere form a melt-gas interface. The outlet port 12 is in fluid communication with an exhaust system (not shown) of the ingot puller.

In this regard, the ingot puller apparatus 23 shown in FIG. 1 and described herein is exemplary and other crystal puller configurations and arrangements may be used to pull a single crystal silicon ingot from a melt unless stated otherwise.

Figure 2:
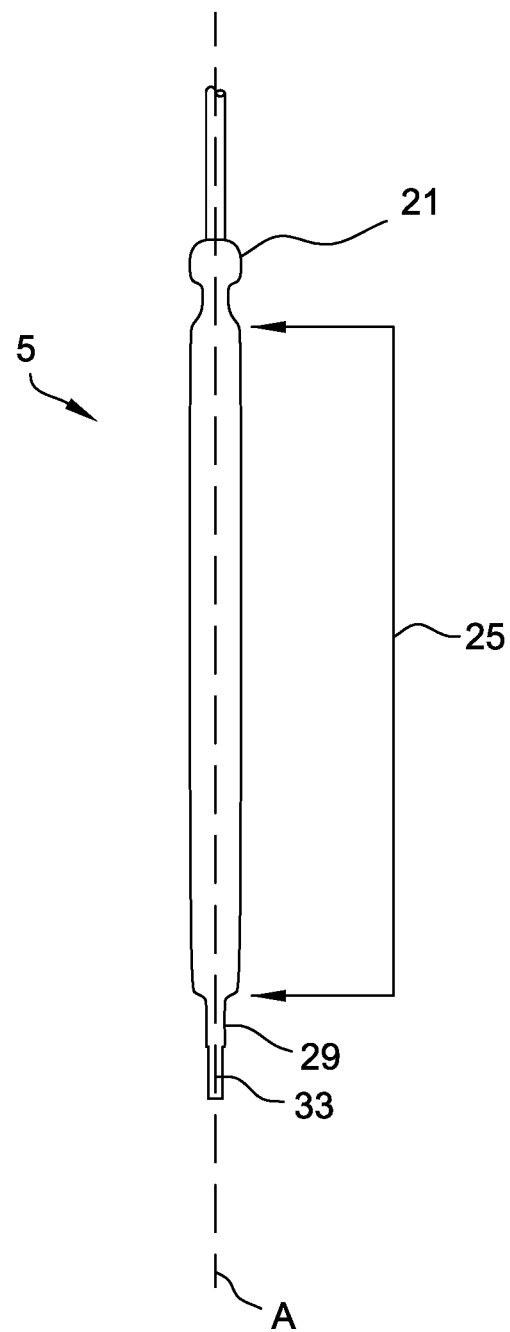
FIG. 2 is a sample rod grown from a silicon melt.
Figure 6:
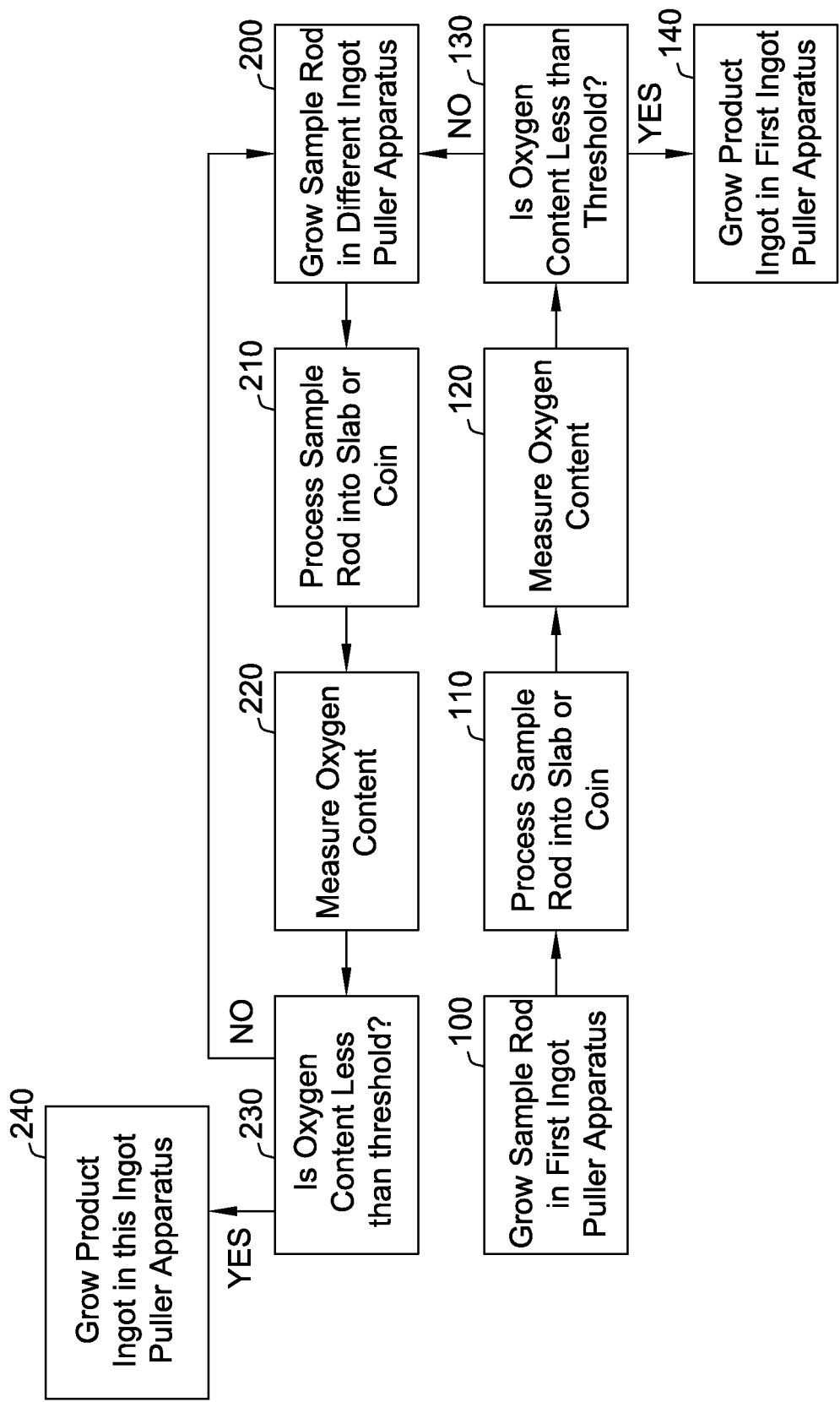
FIG. 6 is a block diagram of an embodiment of a method for producing a silicon product ingot.

In accordance with embodiments of the present disclosure, after solid silicon is added to the crucible 22 and the heating system 39 is operated to melt-down the solid silicon, a sample ingot or rod is pulled from the melt (step 100 of FIG. 6). An example sample rod 5 is shown in FIG. 2. The rod 5 includes a crown portion 21 in which the rod transitions and tapers outward from the seed to reach a target diameter. The rod 5 includes a constant diameter portion 25 or cylindrical main body or simply "body", of the crystal which is grown by increasing the pull rate. The main body 25 of the sample rod 5 has a relatively constant diameter. The rod 5 includes a tail or end-cone 29 in which the rod tapers in diameter after the main body 25. When the diameter becomes small enough, the rod 5 is then separated from the melt. The rod 5 has a central longitudinal axis A that extends through the crown portion 21 and a terminal end 33 of the ingot.

The growth conditions of the sample rod 5 may be selected from generally any of the suitable growth conditions available to those of skill in the art. The sample rod 5 may be a single crystal with a body of the sample rod having zero dislocations. The sample rod 5 may be grown with a locked seed lift (i.e., fixed pull speed with varying diameter such as +/−about 5 mm) or active seed lift (pull speed varied to maintain target diameter).

The sample rod 5 has a diameter less than the product ingot that is grown after the sample rod. For example, the diameter of the sample rod may be less than 0.75 times the diameter of the product ingot, less than 0.50 times, less than about 0.25 times or less than 0.1 times the diameter of the product ingot. In some embodiments, the diameter of the sample rod is less than about 150 mm or less than about 100 mm, less than about 50 mm, less than about 25 mm, or less than about 20 mm (e.g., from about 5 mm to about 150 mm, from about 5 mm to about 100 mm, from about 5 mm to about 50 mm, from about 5 mm to about 25 mm or from about 10 mm to about 25 mm). Generally, the diameter of the rod 5 is measured by measuring the rod along several axial locations (e.g., within a constant diameter portion of the rod if the rod has a crown and/or tapered end) and averaging the measured diameters (e.g., measuring 2, 4, 6, 10 or more diameters along the length and averaging). In some embodiments, the largest diameter of the sample rod is less than about 150 mm or less than about 100 mm, less than about 50 mm, less than about 25 mm, or less than about 20 mm (e.g., from about 5 mm to about 150 mm, from about 5 mm to about 100 mm, from about 5 mm to about 50 mm, from about 5 mm to about 25 mm or from about 10 mm to about 25 mm).

In some embodiments, the rod 5 has a diameter that generally corresponds to the diameter of the neck portion of a product ingot grown in the crystal puller. For example, the rod may have a diameter of less than 50 mm, less than 25 mm, or less than 20 mm.

The sample rod 5 may have any suitable length. In some embodiments, the rod (e.g., after cropping) has a length of less than about 300 mm, less than about 200 mm or less than about 100 mm (e.g., from about 25 mm to about 300 mm).

Figure 3:
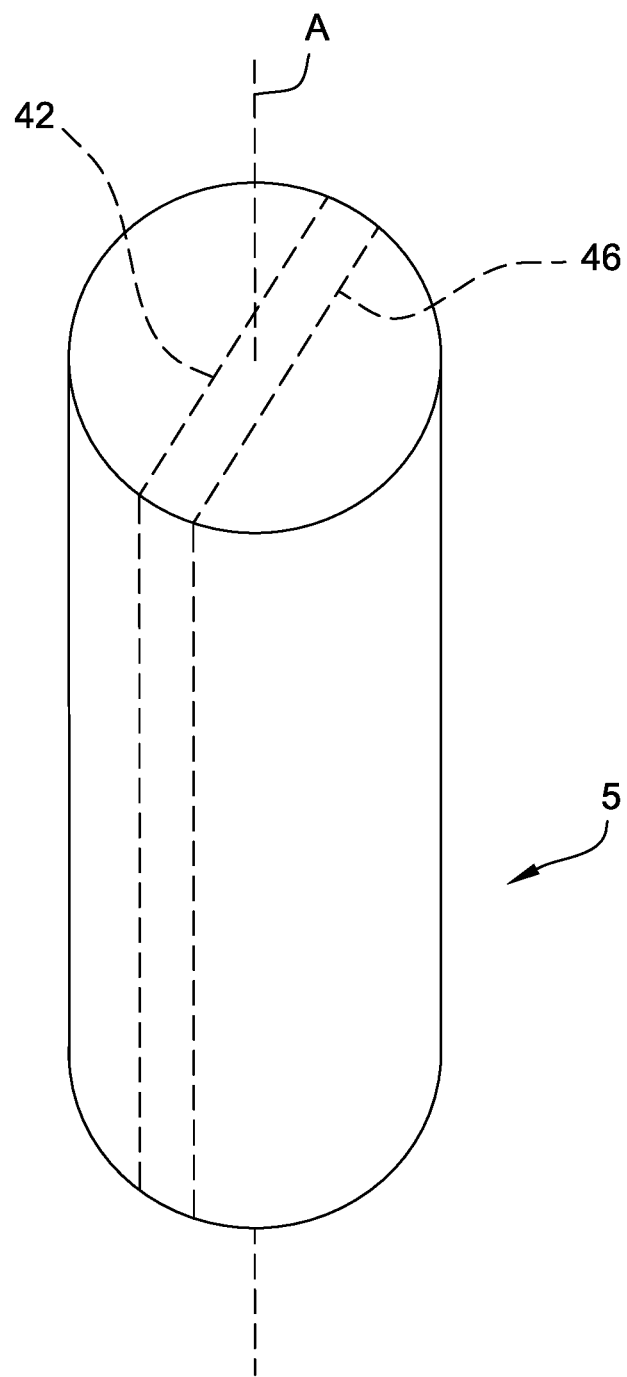
FIG. 3 is a schematic perspective view of a sample rod showing two crop planes along which the rod is cropped to form a center slab.
Figure 4:
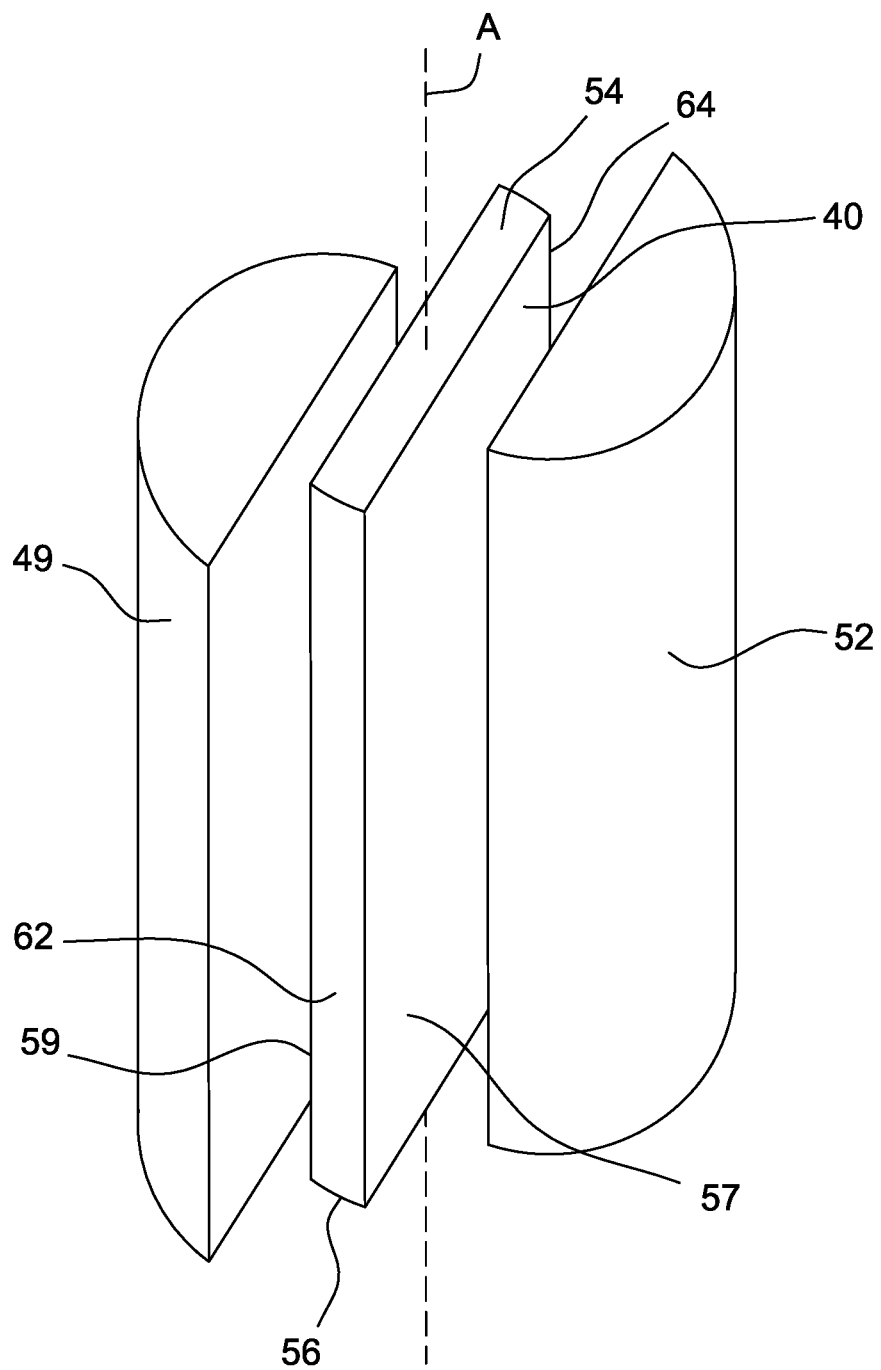
FIG. 4 is a schematic perspective view of a cropped sample rod that includes a center slab.
Figure 5:
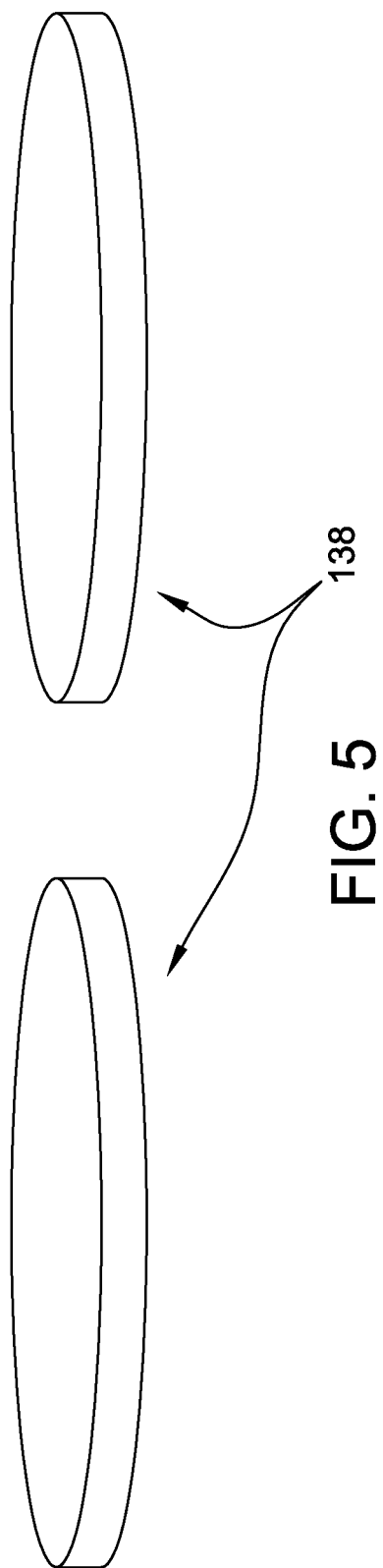
FIG. 5 is a perspective view of one or more coins cut from the sample rod.

In a second step 110 (FIG. 6), after the sample rod 5 is grown, the sample rod is processed to form a sample rod segment such as a center slab 40 (FIG. 4) or a coin 138 (FIG. 5). In embodiments in which a slab 40 is formed, the crown and tail of the sample rod 5 may be removed, such as by use of a wire saw. As shown in FIG. 4, the sample rod 5 is then cropped to form the slab 40. The sample rod 5 may be cropped by a tabletop cutting machine (e.g., Minitom, available from Struers (Westlake, Ohio)) or by use of a diamond wire saw (e.g., DTW wire saw). The sample rod 5 is cropped along a first crop plane 42 (FIG. 3) and is cropped along a second crop plane 46 to form first and second crop portions 49, 52 (FIG. 4) and the slab 40. The first crop plane 42 and the second crop plane 46 are parallel to each other and are parallel to the central longitudinal axis A of the sample rod 5. The slab 40 may have any suitable thickness for oxygen measurement such as, for example, between about 5 mm and about 0.1 mm, between about 3 mm and about 0.5 mm, or between about 3 mm and about 1 mm. The slab 40 may be generally square or rectangular in cross-section. The first and second sides 62, 64 of the slab 40 may be slightly rounded due to the contour of the sample rod 5 or the slab 40 may be further cropped to form planar sides 62, 64. The first and second cropped, planar surfaces 57, 59 of the slab 40 may be ground to flatten the surfaces.

Generally, the center slab 40 includes at least a portion of the central axis A of the uncropped sample rod 5. In some embodiments, the cropping method may be variable to account for axial non-uniformity in the sample rod diameter to allow the center slab 40 to capture as much of the axisymmetric center line of the rod 5 as possible. For example, the slab 40 may include at least about 10% of the central axis A of the sample rod 5 (i.e., the sample rod just prior to cropping to form the center slab), or at least about 25%, at least about 50%, at least about 75%, or at least about 90% of the central axis A of the sample rod 5. In some embodiments, after cropping, the central axis A of the cropped sample rod 5 extends through the entire length of the slab 40 (e.g., from first end 54 to second end 56 of the slab 40).

In some embodiments, the rod segment (e.g., slab 40 or coin 138 described below) is rinsed, etched (e.g., mixed acid etched for at least 3 minutes), and dried prior to measurement of the oxygen content of the slab 40. In some embodiments such as when the resistivity of the rod segment is also measured, the rod segment may be subjected to a rapid thermal anneal such as at temperature between 500° C. to about 1000° C. (e.g., before or after oxygen measurement).

In some embodiments, rather than forming a center slab 40, one or more coins 138 (FIG. 5) are formed from the sample rod (e.g., from a cross-sectional crop of the sample rod). Similar to the slab, the one or more coins 138 may be ground, rinsed, and/or etched prior to measurement of the oxygen content. Multiple coins maybe cut from the same rod (e.g., seed end and opposite end) and compared to the threshold (e.g., averaged and compared to threshold). The one or more coins may each have a thickness of between about 5 mm and about 0.1 mm, between about 3 mm and about 0.5 mm or between about 3 mm to about 1 mm.

Once the slab 40 or coin 138 is processed, the oxygen content of the slab 40 or coin is measured in step 120 (FIG. 6). For example, the oxygen content may be measured by Fourier-transform infrared spectroscopy (i.e., by analyzing the rod segment with a Fourier-transform infrared spectrometer). FTIR spectrometers may be obtained commercially such as the QS-300 Spectrometer from Bio-Rad (Hercules, California).

Once the oxygen content of the sample rod is measured, the oxygen content may be compared to a threshold oxygen content in step 130 (FIG. 6). The threshold oxygen content is a maximum oxygen content (e.g., previously established maximum) below which product ingots with relatively low oxygen content can be produced. Sample ingots which have an oxygen content above this maximum may be not suitable for forming low oxygen ingots (despite control of the growth parameters to lower oxygen content) and may be used to form a product ingot other than a low oxygen ingot. For example, the threshold oxygen content to which the oxygen content of the sample rod (as measured from the slab or coin) is a maximum oxygen content of 5.0 ppma, 4.0 ppma, 3.5 ppma, 3 ppma or even less than 2.5 ppma (as measured by ASTM80).

If the oxygen content is below the threshold oxygen content, a product ingot is pulled from the melt in step 140 (FIG. 6) (i.e., the same melt from which the sample rod was grown). The product ingot has a diameter greater than the diameter of the sample rod (i.e., the diameter of the constant diameter portion of the sample rod is less than the diameter of the constant diameter portion of the ingot). The product ingot may have a diameter of 150 mm or more or, as in other embodiments, 200 mm or more, or 300 mm or more (e.g., 450 mm or more). The product ingot has a relatively low oxygen content such as less than 5.0 ppma, 4.0 ppma, 3.5 ppma, 3 ppma or even less than 2.5 ppma. The product ingot may have any suitable resistivity and, in some embodiments, a relatively high resistivity such as at least 1000 ohm-cm or even at least 7,500 ohm-cm.

In some embodiments, polycrystalline silicon is not added during the growth of the ingot (e.g., as in a batch process). In other embodiments, polycrystalline silicon is added to the melt as the product ingot is grown (e.g., as in a continuous Czochralski method).

When the sample rod has an oxygen content above the threshold, the first product ingot is not grown in the ingot puller apparatus (i.e., the first ingot puller apparatus). Instead, a second product ingot with a higher oxygen specification is grown with the first ingot puller apparatus (i.e., the second product ingot has an oxygen content greater than the first product ingot). For example, the first product ingot may have an oxygen content of less than 5 ppma and the second product ingot may have an oxygen content of greater than 5 ppma.

The first product ingot may be then grown from a second ingot puller apparatus that is different from the first ingot puller apparatus. A second sample rod may be grown in the second ingot puller apparatus in step 200 (FIG. 6) to determine if the ingot puller apparatus is suitable to form a relatively low oxygen ingot before the first ingot is grown (i.e., by forming a slab or one or more coins from the sample rod in step 210, measuring the oxygen content of the slab or one or more coins in step 220, and determining if the oxygen content is less than the threshold in step 230). If the oxygen content of the sample rod grown from the second ingot puller apparatus is not less than the threshold oxygen content, subsequent ingot puller apparatus may be tested until an apparatus in which the oxygen content of a sample rod grown from the apparatus is less than the threshold oxygen content is found (e.g., testing three, four, five or more apparatus until a suitable ingot puller apparatus is found). If the oxygen content of the sample rod grown from the second ingot puller apparatus is less than the threshold oxygen content, the product ingot is grown in step 240.

Figure 8:
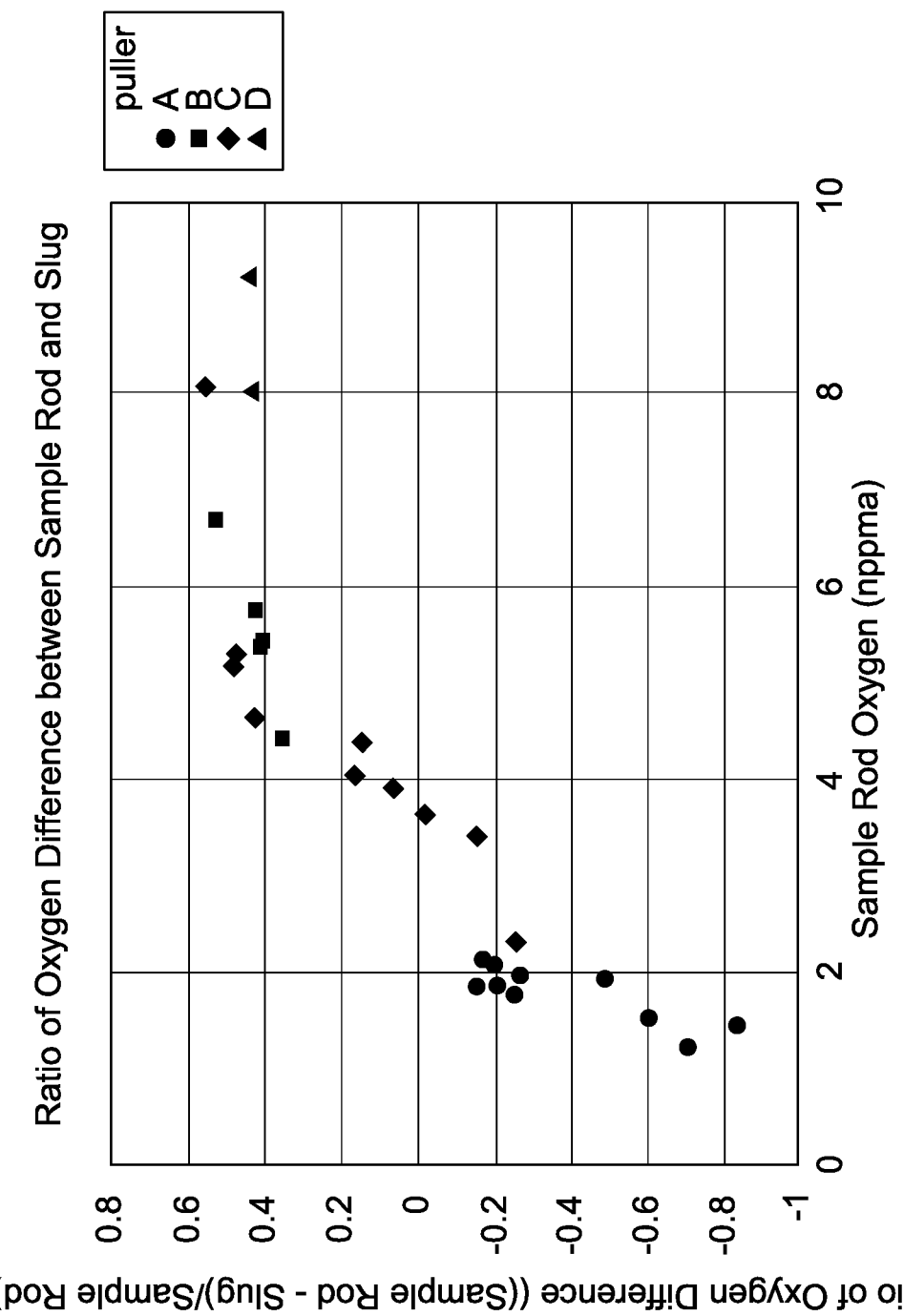
FIG. 8 is a graph showing the correlation between sample rod oxygen content and product ingot oxygen content for 200 mm and 300 mm product ingots grown on various ingot puller apparatus.
Figure 9:
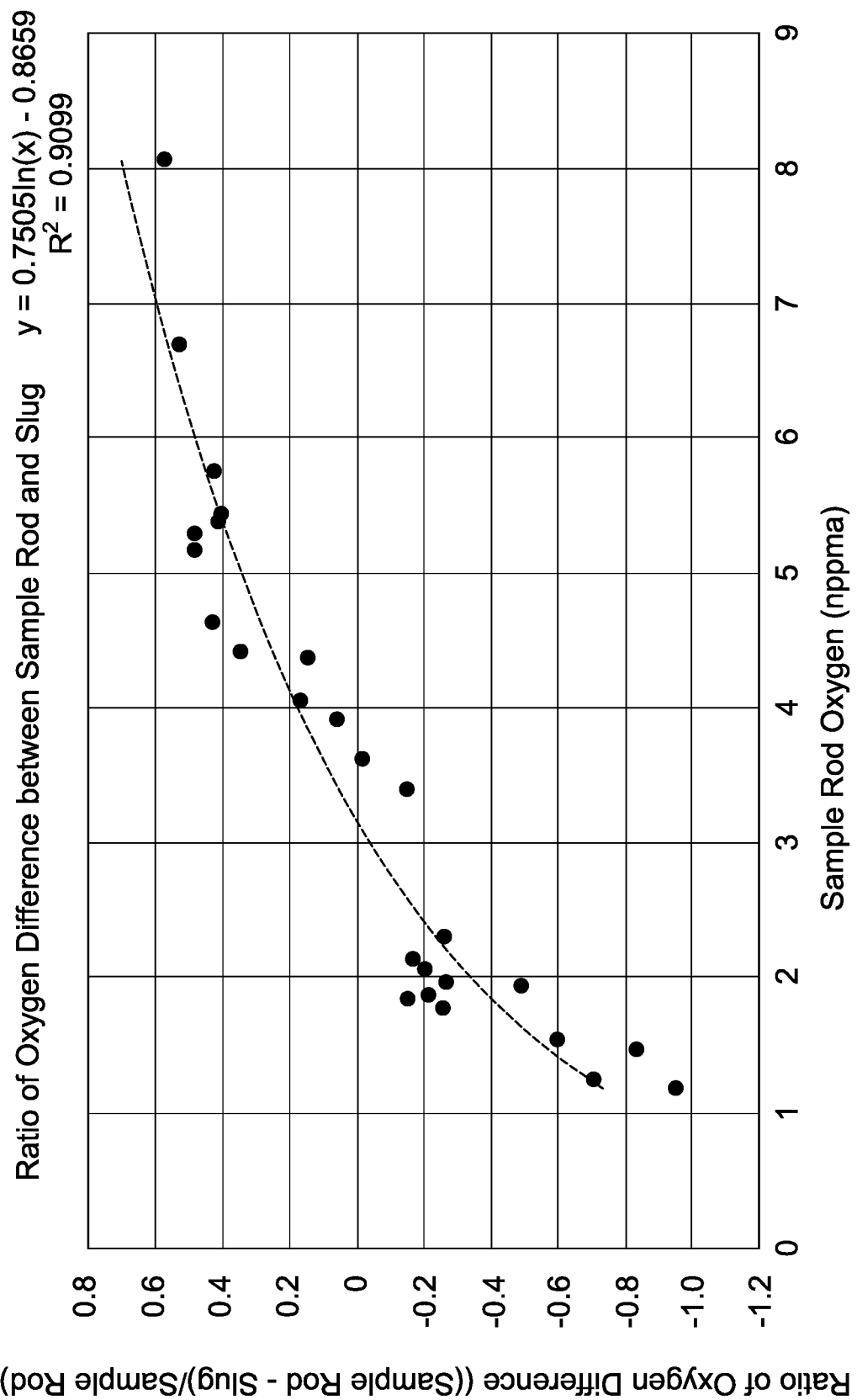
FIG. 9 is a graph showing the correlation between sample rod oxygen content and product ingot oxygen content for 200 mm product ingots grown on various ingot puller apparatus.

The threshold oxygen content may be determined by growing a plurality of sample rods in different ingot puller apparatus and comparing the oxygen content of each sample rod (e.g., average between seed end and opposite end) to the oxygen content of the product ingot (e.g., slug from midpoint). The comparison allows the maximum oxygen content of the sample rod at which a product ingot having the requisite oxygen content (e.g., upper specification limit) to be determined. A correlation between the sample rod oxygen content and the product ingot oxygen content may be formed as shown in FIGS. 8 and 9 and as discussed below.

In some embodiments in which multiple ingot puller apparatus are available to grow the relatively low oxygen product ingots (e.g., less than 5.0 ppma), sample rods may be grown from a melt in each of the ingot puller apparatus (e.g., evaluating two, three, four or more ingot puller apparatus). The oxygen content of each sample rod grown from each ingot puller apparatus may be compared. The product ingot (with the relatively low oxygen target) may be grown in the ingot puller apparatus in which the sample rod having the lowest oxygen content was grown.

Once an ingot puller apparatus from which a sample rod having an oxygen content less than threshold oxygen content is identified, in addition to the first product ingot having a relatively low oxygen content (e.g., less than 5.0 ppma), the ingot puller apparatus may be used to grow additional ingots having relatively low oxygen content (e.g., two or more, three or more, five or more, or ten or more ingots having an oxygen content of 5 ppma or less).

Compared to conventional methods for producing a single crystal silicon ingot, the methods of the present disclosure have several advantages. Without being bound by any particular theory, it has been found that ingot puller apparatus with the same design (i.e., hot zone design) will be characterized by different oxygen capability (i.e., ability to grow low oxygen ingots such as ingots less than 5.0 ppma) with wide variability. By growing a sample ingot from one or more ingot puller apparatus which is a candidate for a production run of relatively low oxygen ingots, the oxygen contents of the sample rods may be compared to a threshold oxygen concentration below which it is believed low oxygen ingots may be produced. Alternatively or in addition, the oxygen content between sample rods from different pullers may be compared to determine which ingot puller apparatus may produce the lowest oxygen content in silicon product ingots. Some ingot puller apparatus are not able to achieve low oxygen ingots even when the process conditions are controlled for low oxygen production. The method reduces the amount of charge that is wasted as the ingot puller apparatus and melt may be repurposed for a different customer product (i.e., other than low oxygen such as above 5.0 ppma) if the ingot puller apparatus is found to be unable to produce low oxygen product ingots. The method is particularly advantageous when it is desired to increase the throughput of low oxygen ingot production by bringing additional ingot puller apparatus on board for low oxygen production. The method identifies whether an ingot puller apparatus may be suitable for low oxygen production in less than 24 hours (which includes pulling the sample rod, processing the rod into a rod segment such as a slab or coin, and measuring oxygen by FTIR) and with a relatively small amount of the charge used for the characterization (e.g., less than 0.1 kg). This is compared to conventional methods in which a full zero dislocation ingot is grown to determine oxygen capability.

EXAMPLES

The processes of the present disclosure are further illustrated by the following Examples. These Examples should not be viewed in a limiting sense.

Example 1: Sample Rod Oxygen Content as a Predictor of Product Ingot Oxygen

For four different ingot puller apparatus, a sample rod having a diameter of less than 50 mm was grown before a product ingot was grown. The oxygen content of the sample rod at the seed end and the opposite end were measured and averaged. The oxygen content of the product ingot was measured at the midpoint (i.e., where oxygen is mostly stable and flat rather than a transient section like the seed end or opposite end). Ingot puller apparatus A-C were 200 diameter pullers and ingot puller apparatus D was a 300 mm puller.

Figure 7:
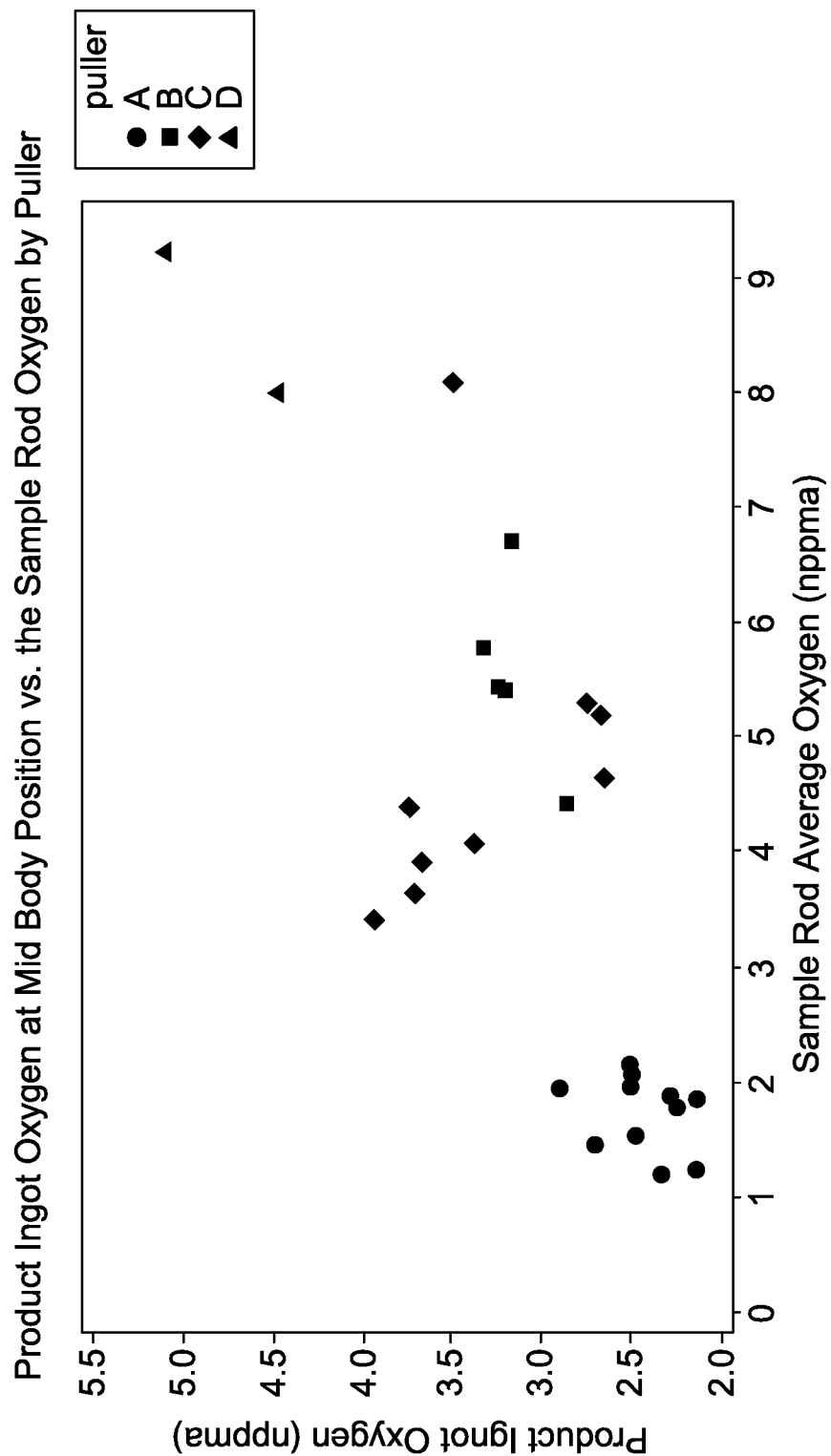
FIG. 7 is a graph of the sample rod oxygen content verse the product ingot oxygen content.

As shown in FIG. 7, the oxygen concentration of the product ingot correlates well with the sample rod grown before the product ingot. With the exception of a few data points, the oxygen capability of each puller is clustered within a certain window reflecting capability of the characterization method. Operationally, Puller A had the best overall yield and throughput (i.e., production volume in "prime" inches for an ingot puller per unit time) verse the oxygen specification requirements for RF SOI and puller D had the worst yield, validating the sample rod response.

FIG. 8 shows the relationship between a mid-length product ingot slug and sample rod oxygen by plotting the ratio of oxygen (sample rod average-slug)/sample rod average verse the sample rod average oxygen for all data (200 mm (pullers A-C) and 300 mm (puller D)). FIG. 9 shows a plot for 200 mm pullers only and includes the best fit trendline.

The best fit curve shown in FIG. 9 has fairly high least squares fit which means that the sample rod oxygen is fairly well correlated to the slug oxygen in the stable oxygen region of the product ingot. Oxygen in this range is mainly dictated by the high evaporation of SiO gas and low dissolution of the crucible. Puller A shows low oxygen in both sample rod and slug which means this puller has different hot spot at the crucible wall and evaporation rate of SiO gas verse the other pullers.

As FIG. 8 shows, the 300 mm crystal data has >7 ppma sample rod oxygen, and the ratio of the oxygen difference between the sample rod and the slug is lower than the 200 mm cases, and the oxygen of the sample rod and the product ingot slug are higher than the 200 mm cases. This means, even if the oxygen incorporated into the 300 mm growing crystal is higher than that of the 200 mm crystals, the oxygen of the sample rod is much higher than that of 200 mm sample rod which results in the ratio of the oxygen difference in the 300 mm crystal being lower than that of the 200 mm crystal in the similar sample rod oxygen case. In both ingot diameters, the crucible diameter size was the same, which means the 300 mm ingot is grown with less free melt surface than the 200 mm ingot so the evaporation of SiO gas is decreased. As a result, the oxygen of the product ingot slug is increased. Further, the diameter of the reflector above the melt is different between 300 mm and 200 mm, so the radial gas velocity above the melt free surface in the sample rod growth was slower than 200 mm sample rod and it resulted in higher oxygen in the sample rod.

As shown in FIG. 9, this prediction is valid when the hot zone configuration and diameter of the product ingot is the same. In addition, the relation between sample rod oxygen and product ingot slug oxygen may be used to confirm and predict the oxygen at steady state of the product ingot. Variation in the data as shown in FIGS. 8 and 9 can be caused by the difference of hot zone degradation such as heater and insulation. However, the relation is maintained and high oxygen in the sample rod indicates high oxygen in the prime body section of the product ingot.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for producing a product ingot having an oxygen concentration of less than 5 ppma, the method comprising:
   adding solid silicon to a crucible of a first ingot puller apparatus;
   heating the solid silicon in the crucible of the first ingot puller apparatus to cause a first silicon melt to form in the crucible;
   pulling a first sample rod from the first silicon melt, the first sample rod having a first sample rod diameter;
   measuring an oxygen content of the first sample rod;
   adding solid silicon to a crucible of a second ingot puller apparatus;
   heating the solid silicon in the crucible of the second ingot puller apparatus to cause a second silicon melt to form in the crucible;
   pulling a second sample rod from the second silicon melt, the second sample rod having a second sample rod diameter;
   measuring an oxygen content of the second sample rod;
   comparing the oxygen content of the first sample rod to the oxygen content of the second sample rod; and
   growing the product ingot in the ingot puller apparatus in which the sample rod having a lower oxygen content was grown, the product ingot having a diameter, the first sample rod diameter and second sample rod diameter each being less than the diameter of the product ingot.

2. The method as set forth in claim 1 further comprising:
   adding solid silicon to a crucible of a third ingot puller apparatus;
   heating the solid silicon in the crucible of the third ingot puller apparatus to cause a third silicon melt to form in the crucible;
   pulling a third sample rod from the third silicon melt, the third sample rod having a sample rod diameter;
   measuring an oxygen content of the third sample rod;
   comparing the oxygen content of the first sample rod to the oxygen content of the third sample rod; and
   growing the product ingot in the ingot puller apparatus in which the sample rod having the lowest oxygen content of the first, second and third sample rods was grown.

3. The method as set forth in claim 1 wherein the product ingot is a first product ingot, the method comprising growing a second product ingot in the ingot puller apparatus in which the sample rod having a higher oxygen content was grown.

4. The method as set forth in claim 1 wherein:
   a first slab is formed from the first sample rod;
   measuring the oxygen content of the first sample rod comprises measuring the oxygen content of the first slab;
   a second slab is formed from the second sample rod; and
   measuring the oxygen content of the second sample rod comprises measuring the oxygen content of the second slab.

5. The method as set forth in claim 1 the oxygen contents of the first and second sample rods are measured by Fourier-transform infrared spectroscopy.

6. The method as set forth in claim 3 wherein the second product ingot has an oxygen content of greater than 5 ppma.

7. The method as set forth in claim 4 wherein:
   the first slab comprises at least a portion of a central axis of the first sample rod, the first slab having a thickness of between about 5 mm and about 0.1 mm; and
   the second slab comprises at least a portion of a central axis of the second sample rod, the second slab having a thickness of between about 5 mm and about 0.1 mm.

8. The method as set forth in claim 4 comprising etching the first slab prior to measuring the oxygen content of the first sample rod.

9. The method as set forth in claim 8 comprising etching the second slab prior to measuring the oxygen content of the second sample rod.

10. The method as set forth in claim 1 comprising forming one or more coins from the first sample rod, wherein measuring an oxygen content of the first sample rod comprises measuring the oxygen content of one or more of the coins.

11. The method as set forth in claim 10 comprising etching the one or more coins prior to measuring the oxygen content of the sample rod.

12. The method as set forth in claim 10 comprising forming one or more coins from the second sample rod, wherein measuring an oxygen content of the second sample rod comprises measuring the oxygen content of one or more of the coins.

13. The method as set forth in claim 1 wherein the diameter of the first sample rod is less than 50 mm and the diameter of the second sample rod is less than 50 mm.

14. The method as set forth in claim 1 wherein the diameter of the first sample rod is from about 5 mm to about 25 mm and the diameter of the second sample rod is from about 5 mm to about 25 mm.

* * * * *